United States Patent [19]
Mixon et al.

[11] Patent Number: 5,764,505
[45] Date of Patent: Jun. 9, 1998

[54] GAS DISCHARGE LASER CONTROL SYSTEMS USING MULTIPLE CPU'S WITH SHARED MEMORY ON A COMMON BUS

[75] Inventors: Curtiss Lynn Mixon, Encinitas; Ralph Kenneth Nair, II, Escondido, both of Calif.

[73] Assignee: Cymer, Inc., San Diego, Calif.

[21] Appl. No.: 589,984

[22] Filed: Jan. 23, 1996

[51] Int. Cl.$^6$ ........................................... H01S 3/00
[52] U.S. Cl. ........................... 364/131; 364/132; 372/33; 372/29
[58] Field of Search ........................... 364/131–133, 364/228.9–230, 238.3, 240, 243, 267, 230.4, 232.4, 243.1; 395/468, 480, 800.16, 800.31; 372/57, 55, 38, 25, 33

[56] References Cited

U.S. PATENT DOCUMENTS

| | | | |
|---|---|---|---|
| 4,677,636 | 6/1987 | Laudenslager et al. | 372/68 |
| 4,740,882 | 4/1988 | Miller | 364/132 |
| 4,961,131 | 10/1990 | Ashida | 364/132 |
| 5,036,453 | 7/1991 | Renner et al. | 364/200 |
| 5,113,514 | 5/1992 | Albonesi et al. | 395/425 |
| 5,463,650 | 10/1995 | Ito et al. | 372/57 |
| 5,481,456 | 1/1996 | Ogura | 364/132 |
| 5,481,750 | 1/1996 | Parise et al. | 364/132 |
| 5,519,602 | 5/1996 | Yellowley et al. | 364/132 |
| 5,646,954 | 7/1997 | Das et al. | 372/55 |
| 5,657,334 | 8/1997 | Das et al. | 372/33 |

FOREIGN PATENT DOCUMENTS

| | | |
|---|---|---|
| 0 308 511 | 2/1988 | European Pat. Off. |
| 0 680 121 | 4/1995 | European Pat. Off. |
| 02143481 | 6/1990 | Japan |

*Primary Examiner*—James P. Trammell
*Assistant Examiner*—Bryan Bui
*Attorney, Agent, or Firm*—Blakely, Sokoloff, Taylor & Zafman LLP

[57] ABSTRACT

A laser control system with multiple CPU's having shared memory on a common bus to provide high performance, relatively lost-cost, laser control. In the system disclosed, a first CPU which handles most, if not all, communication to and from the laser control system and which may communicate with one or more additional CPU's through the shared memory, so as to be capable of providing the software and operating commands to one or more additional processors on the common bus. A second processor is provided to control the intensity and repetition rate of a gas laser responsive to the program and commands made available thereto through the shared memory by the first processor. In addition, the second processor may directly respond to specific controls provided thereto to allow operation of the laser directly in response to control signals provided thereto from the outside, rather than based on parameters provided thereto by the first processor. Additional processors may be provided on the common bus for other common, typically dedicated functions. The use of shared memory on a common bus for communication between processors allows automatic operation of a laser system through communication with only a single processor, simplifying system initialization and implementation of software updates. The controller is configured around a popular bus structure to make maximum use of commercially available board level subsystems to provide a highly versatile laser controller without requiring substantial and expensive special circuit board design and fabrication.

18 Claims, 1 Drawing Sheet

GAS DISCHARGE LASER CONTROL SYSTEMS USING MULTIPLE CPU'S WITH SHARED MEMORY ON A COMMON BUS

BACKGROUND OF THE INVENTION

1. Field of the Invention

The present invention relates to the field of gas discharge laser controllers.

2. Prior Art

Gas discharge lasers of various kinds are well known in the prior art. Of particular interest to the present invention are excimer lasers operating in the deep ultraviolet region, though the present invention is not necessarily limited to use with such laser equipment.

Excimer lasers are utilized for various purposes, many of which may have their own separate control requirements. By way of example, excimer lasers are useful for ablative material removal, providing clean material removal for the drilling of holes, patterning and the like, in various materials. Generally, in such applications, accurate control of the precise intensity of each laser pulse is not particularly important, though approximate energy per pulse, pulse rate, and perhaps the total number of pulses, are important. Of course, on/off control is also important to initiate the laser pulsing after positioning of the work piece or work pieces, and to hold the pulsing off until a subsequent work piece is positioned for processing.

In other applications, such as in photoresist exposure during semiconductor device processing, close control of the energy in each pulse, as well as the pulse rate itself, is very important. In particular, underexposure of a photoresist will result in the photoresist not washing away which should wash away in a subsequent operation, or alternatively photoresist washing away which should not wash away, typically resulting in faulty integrated circuit region definitions and a malfunction in the resulting integrated circuit. Over exposure, on the other hand, while adequately exposing the photoresist intended to be exposed, will reduce the line definitions in the finished integrated circuit due to some exposure of immediately adjacent photoresist caused by scattering, etc. of the exposing radiation. Consequently, with the ever decreasing geometry sizes of integrated circuits, it is important to have as uniform exposure of the photoresist over its entire area as possible. Also, in the newer photo exposure systems, only a small part of the photoresist area is exposed through a mask at any one time. In such systems there is relative motion between the source of laser radiation and the mask and wafer, so that the entire photoresist area is exposed through the mask over the time period of a relatively large number of laser pulses. Thus, in such exposure systems, it is particularly important to control not just the total exposure, but to control the energy in each pulse. Typically this is done by providing compensation to the system parameters defining the pulse energy of each pulse based upon the difference between the measured energy in either the prior pulse, or a similar prior pulse and the desired energy level of each pulse.

Analytical techniques to determine the adjustment of the various laser parameters to compensate for the difference between the desired energy per pulse and the actual measured energy per pulse on the prior pulse are well known in the prior art. Such methods, however, require not only the measurement of the energy in the prior pulse, but the use of that measurement, together with other parametric measurements of the laser system, in an analysis to determine the parameter adjustments to obtain the proper pulse energy in the next pulse based on the error in energy in the prior pulse. However, such techniques require a significant amount of data processing, and therefore are most easily done using a dedicated processor or controller for this purpose.

Other responsibilities of a laser controller are to communicate with and respond to a host computer or other source of commands, and to monitor and/or control various parts of the laser system to assure the desired operation thereof, to maintain statistical information with respect to operation over a period of time, and to monitor such things as maintenance intervals and lifetimes of various laser hardware modules, to monitor and control the gas system, etc. Many of such additional tasks are not done on a per-pulse basis, but rather on a variation over time type basis, such as by way of example, the monitoring of temperature in various parts of the laser system. Consequently, while these functions are also very important to the proper operation, life and maintenance of the laser system, timing for their accomplishment is not as critical as in the adjustment of the laser on a pulse to pulse basis.

Thus, an excimer laser consists of a number of hardware components which must act together in a certain way under the direction of a control system in order to produce a pulsed ultraviolet light beam output that meets certain customer required specifications. Each of these hardware components can be classified as either a device which is used for monitoring or a device which is used for controlling a process in real time. Monitoring and controlling devices can be combined into groups where each group is considered to be a control subsystem for a real time process. The software in the laser controller can then be subdivided into tasks corresponding to the control subsystems where each task monitors one or more inputs, makes decisions about the process being monitored, and then as a result of the decisions exerts control to change the real time process (and therefore the inputs being monitored). Because each real time process proceeds at its own speed, each corresponding task has a different time limit in which it requires a control response. If the real time process does not receive control within its time constraints, then either the laser light beam output will drift out of the customer imposed specifications, or the laser hardware components become damaged, or worse, a safety hazard is created which may cause harm to the laser operator. Therefore, each task must execute frequently enough so that it can exert control within the time constraints of its associated real time process. As a result, some tasks must execute more frequently than other tasks. It is the challenge of the laser control system to manage many real time processes in progress concurrently and proceeding at different speeds. In order to accomplish this challenge, the laser control system must provide execute time for each task when it needs attention so that all of the concurrent real time processes are properly controlled.

In the prior art laser control systems for which the present invention is intended as a replacement, a multi-processor system was used, comprising a plurality of micro-controllers with one micro-controller serving as a master device and typically five additional micro-controllers being provided. Each micro controller in these prior art laser control systems had its own memory associated therewith, with the micro controllers communicating between each other over dedicated serial lines. The resulting controller structure required the separate downloading of the program for each micro controller, making initiation of the system at start-up rather complicated, as well as software upgrades difficult. Also, because of limitations in the micro controllers and the resulting laser control systems, the prior art system was limited in the maximum laser pulse rate it could support, and would not operate at the higher pulse rates now encountered, such as 1 KHz.

BRIEF SUMMARY OF THE INVENTION

A laser control system with multiple CPU's having shared memory on a common bus to provide high performance and relatively low-cost, laser control described. In the system disclosed, a first CPU which handles most, if not all, communication to and from the laser control system for less time-critical tasks and which may communicate with one or more additional CPU's through the shared memory, so as to be capable of providing the software and operating commands to one or more additional processors on the common bus. A second processor is provided to control time-critical tasks, such as the control, on a pulse-to-pulse basis, of the intensity and repetition rate of a gas laser responsive to the program and commands made available thereto through the shared memory by the first processor. In addition, the second processor may directly respond to specific controls provided thereto to allow operation of the laser directly in response to control signals provided thereto from the outside, rather than based on parameters provided thereto by the first processor. The control system is configured to allow each CPU to have its own dedicated I/O resources, thereby keeping contention for I/O resources at a minimum. Additional processors may be provided on the common bus for other common, typically dedicated functions. The use of shared memory on a common bus for communication between processors allows automatic operation of a laser system through communication with only a single processor, simplifying system initialization and implementation of software updates. The controller is configured around a popular bus structure to make maximum use of commercially available board level subsystems to provide a highly versatile laser controller without requiring substantial and expensive special circuit board design and fabrication.

DETAILED DESCRIPTION OF THE INVENTION

Figure 1:
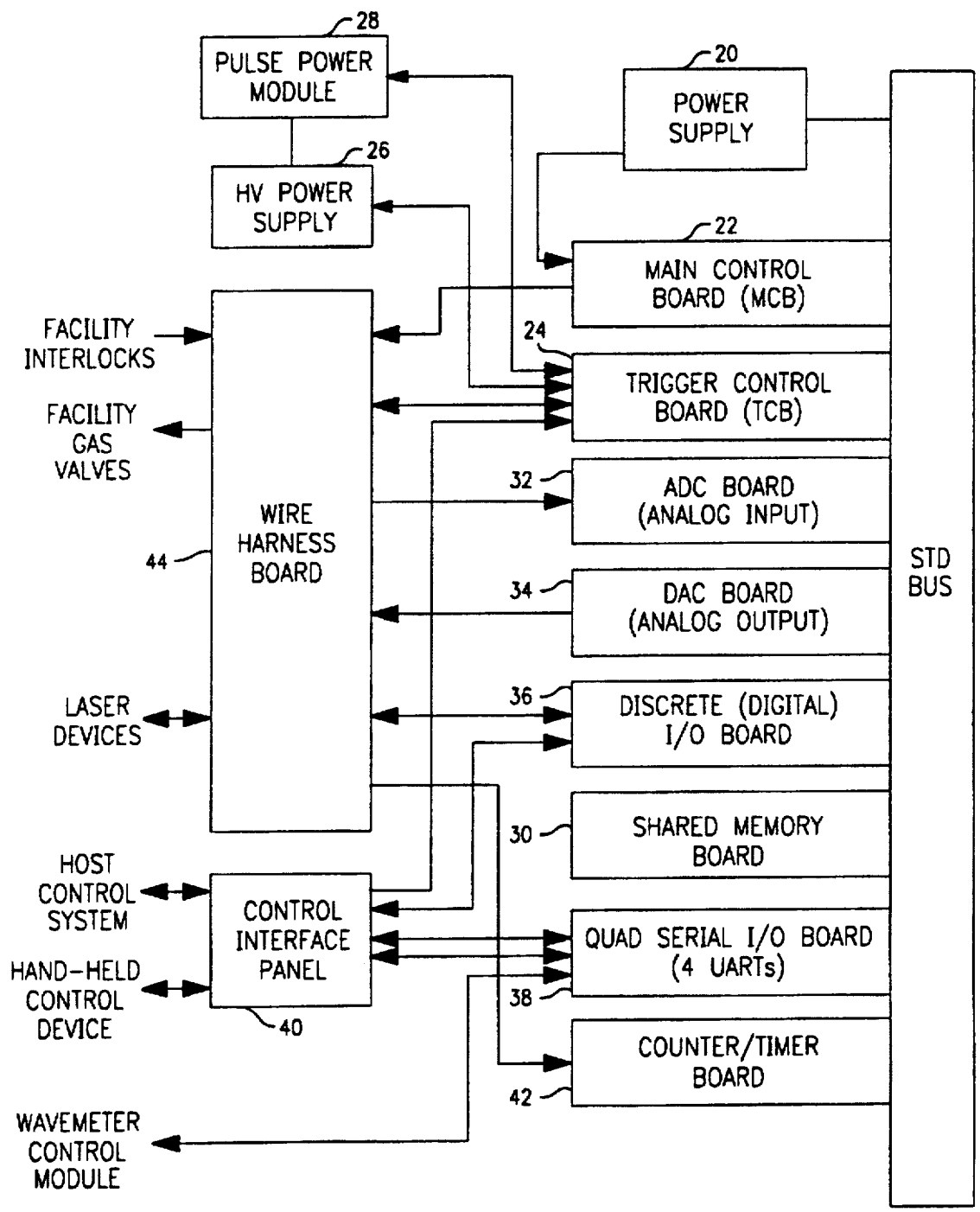
FIG. 1 is a block diagram of the gas discharge laser controller of the present invention.

Referring now to FIG. 1, the gas discharge laser control system of the present invention is constructed around a popular bus structure, specifically in the preferred embodiment, the STD bus, in the form of a card cage accepting STD bus compatible commercially available card level components for the system. In that regard, power for the system is provided by power supply 20, which provides power to the power lines of the bus structure for powering the other boards in the system.

A gas discharge laser control system in accordance with the present invention will include a main control board 22, containing a processor and associated support circuitry, which will function as the master processor in the system. In the preferred embodiment, the main control board 22 is a single board computer having, at a minimum, an Intel type 486 processor with a minimum of 25 MHz clock speed, 128 Kbytes of battery backed-up RAM (random access memory), at least 512 Kbytes of flash memory and at least 512 Kbytes DRAM. This STD-80/MPX compatible processor board will have the capability of becoming a bus master in a multi-processor environment. Those skilled in the art will recognize that as operational demands increase for the laser control system, microprocessors which are faster and more powerful and with larger memories will be required in the configuration specified herein.

Also included in the gas discharge laser control system is a trigger control board 24, which operating on its own program, will control a separate high voltage power supply 26 and the pulse power module 28 to provide the pulse control and trigger for each pulse of the laser. In the preferred embodiment, the trigger control board (TCB) is also a single board computer having, at a minimum, an Intel type 486 processor with a minimum of 25 MHz clock speed, at least 128 Kbytes of battery-backed RAM, at least 512 Kbytes of flash memory and at least 512 Kbytes DRAM. This STD-80/MPX compatible processor board will also have the capability of becoming a bus master in a multi-processor environment. An SBX high speed serial/parallel I/O board is also provided which resides on the TCB for pulse-to-pulse interface capability.

The memory on the main control board 22 is dedicated for use by the processor on that board. As specified herein, the processor is at least a 486 processor. Similarly, the memory on the trigger control board 24 is dedicated for use by at least a 486 processor on that board. In addition, however, an additional memory board 30 is provided on the STD bus for shared use by the processors on the main control board 22 and the trigger control board 24. In that regard, the shared memory 30 in the preferred embodiment is a memory card containing at least 64 Kbytes of RAM in the STD bus card cage. It has an address space separate and apart from the address space of the memory on the main control board 22 and the memory on the trigger control board 24, but still within the total address space of the processors on these boards. In this way, data as well as programs may be exchanged between processors by a first processor, such as the processor on the main control board 22, writing such data into the shared memory 30 from which the same may be read by another processor, such as the processor on the trigger control board 24. Further details of this exchange and the activity on the STD bus in general will be subsequently described.

The laser control system of the preferred embodiment also includes an analog-to-digital converter board 32 for receiving analog inputs, and a digital-to-analog converter board 34 for outputting analog signals. The analog input board 32 in the preferred embodiment contains thirty-two 12-bit analog input channels, multiplexed into a single 12-bit analog-to-digital (A/D) converter. Those skilled in the art will recognize that thirty-two channels was a design choice, and that the number of channels for a particular application may vary based upon operational requirements. The output of the analog-to-digital converter board 32 is accessible by the processors on the main control board 22 and the trigger control board 24 as an I/O mapped card. The digital-to-analog converter board 34 in the preferred embodiment contains eight separate 12-bit digital-to-analog output channels, it too being accessible by both processors as an I/O mapped card on the STD bus. As previously stated, eight channels was a design choice which those skilled in the art will recognize may vary depending upon operational requirements. There is also provided a second thirty-two channel A/D converter board, specifically dedicated to trigger control board 24.

Also included in the STD bus card cage is a discrete digital I/O board 36 and a quad serial I/O board 38. The discrete digital I/O board in the preferred embodiment provides a plurality of decoded (dedicated) I/O lines suitable for various functions. By way of specific example, in the preferred embodiment, the discrete digital I/O board 36 provides control of such things as the shutter, a dedicated line having only two states, open and closed.

A control interface panel 40 is provided for communicating with and receiving instructions from a host control system, or alternatively, receiving instructions from a hand-held control device. In general, the host control system and/or hand-held control device provides a customer-defined interface generally including certain dedicated or decoded lines for control signals such as a trigger signal when the same is provided externally to the laser control system of the present invention. Such signals, other than a trigger command itself, are provided to the discrete digital I/O board 36 through the control interface panel 40 as decoded digital signals. In that regard, in one mode of operation the trigger command may come from the host control system, or the hand-held control device, with the trigger command being provided through the control interface panel 40 to directly trigger the trigger control board 24 without intervention of the processor on the main control board 22 or use of the STD bus, all of course in accordance with software then operating in the trigger control board 24 in accordance with this mode.

The quad serial I/O board 38 in the preferred embodiment contains four UART's (universal asynchronous receiver/transmitters) to provide RS-232 communication capabilities to and from the laser control system in addition to the two RS-232 communication ports located on the processor. This type of communication with a system is useful not only for initialization purposes, but also for providing information to the host system regarding laser status and operation as the system is operating.

Finally, also located in the STD bus card cage is a programmable counter/timer board 42 providing programmable timers for the main control board 22 and the trigger control board 24, as well as counters to count events of other devices in the system such as the fan inside the chamber.

Most of the laser functions are monitored and/or controlled either directly from the main control board 22 or the trigger control board 24 through a wire harness board 44 coupled to the various monitoring and control devices, or by one of these boards through the STD bus and through the analog-to-digital converter board 32, the digital-to-analog converter board 34 counter and timer boards, and/or the discrete digital I/O board 36. In that regard, the analog-to-digital converter board provides the ability to interpret analog monitoring signals from the laser system, with the digital-to-analog converter board 34 providing the ability to output analog control signals for controlling analog proportional control devices in the laser system.

The reason each processor board includes its own dedicated I/O resources is to keep contention for the shared I/O resources on the STD bus to a minimum. In that regard, in the preferred embodiment of the present invention, the processors use a bus arbitration scheme as defined by the STD 80-MPX standard. At power-up, the highest priority processor, the master, gains control of the bus. Once the master finishes initialization, control is passed to the first slave processor. While the embodiment described herein only includes a single slave processor, this embodiment will accommodate up to seven processors. Accordingly, if more than one slave processor is used, the initialization process will continue until all slave processors have been initialized. When the last slave processor has been initialized, then the first slave processor establishes communications with the master and requests its program to be loaded. The master then transfers program data to a specific location in shared memory in discrete chunks, such as 2 Kbytes, signaling the slave that data is available upon completion of the transfer of each discrete chunk. The master then waits for the slave to load the program data and signal back for more. This process repeats until the entire program is loaded. The processors then begin operating independently, with each processor constantly checking shared memory for information from each other. Alternatively, an interrupt scheme may be implemented for data passing between processors, providing a more efficient transfer mechanism and relieving the back plane of the STD card cage of a lot of otherwise unnecessary signal traffic.

The advantage realized is that the processors in the gas discharge laser control system of the present invention are configured to serve distinct and different purposes. The master processor has a real-time operating system which, in one embodiment, has approximately 32 tasks under its control. These tasks are database managers, I/O monitoring routines, post-serial and parallel interface managers, user interface tasks, inter-processor data passing tasks, laser gas management and monitoring chamber temperature control, interlock monitoring and reporting, laser state managing, and others. These tasks are generally characterized as the slow, less time-critical tasks within the laser control system.

The trigger control processor, the only slave processor in the specific embodiment described, has the very time-critical tasks, such as the high voltage profiling, energy control, laser repetition rate, high speed user interface, and any laser pulse-to-laser pulse processing that needs to be done. As previously discussed, however, up to seven processors may be dedicated to the handling of very time-critical tasks. As a matter of comparison, in the embodiment described herein, the host processor operates on a 5 millisecond time base, with event timing accuracies of approximately ±10 milliseconds, whereas the slave processor operates on a 100 microsecond time base, with timing accuracies in the ±10 nanosecond range.

The processor on the trigger control board does not have a real-time operating system, but in a preferred embodiment has a program written in a high level programming language, such as C, and takes complete control of all onboard resources as needed. The master processor, on the other hand, uses its real-time operating system to manage system resources so that it can concentrate on handling the complex task of managing the laser system and coordinating the many tasks needed to do this successfully. Specific master tasks may include:

Receive key presses from the hand-held terminal (RS-232)
Display data on the hand-held terminal (RS-232)
Receive commands from the host system (RS-232)
Send replies to the host system (RS-232)
Receive commands from the host system (parallel lines)
Send status information to host system (parallel lines)
Monitor and control the shutter
Monitor and control gas system valves and vacuum pump to implement automated gas procedures
Monitor maintenance intervals and lifetimes of various laser hardware modules
Monitor safety interlock switches
Control safety lamps mounted on top of laser
Manage several data bases:
    Pulse-to-pulse data
    Configuration data Operating parameters
I/O data (analog and pulse inputs)
System errors
Monitor metal fluoride trap
Monitor and control chamber blower fan
Monitor and control chamber gas temperature
Monitor High Voltage pulse power supply
Monitor laser exhaust vent flow
Monitor nitrogen gas supply pressure
Monitor cooling water temperature
Monitor pulse-to-pulse log data for long term trend changes to determine effectiveness of chamber gas
Send commands to trigger (slave) processor
Receive data from trigger (slave) processor
Control laser states of readiness
Monitor and control line narrowing control subsystem While the present invention has been disclosed and described with respect to a certain preferred embodiment thereof, it will be understood by those skilled in the art that the present invention may be altered in various ways and realized in various embodiments without departing from the spirit and scope thereof.

We claim:

1. A gas discharge laser control system comprising:
   a card cage having a back plane defining a bus structure;
   a plurality of processor boards plugged into the card cage so as to be coupled to the bus, each processor board containing a processor and random access memory associated therewith one of the processor boards serving as a master processor board and each remaining processor board serving as a slave processor board, one of said processor boards being a trigger control board for controlling laser pulse energy and triggering the laser discharge;
   a memory board plugged into the card cage so as to be coupled to the bus, the memory board having address space addressable by the processors on the plurality of processor boards, whereby information written to the memory board by one of the plurality of processors over the bus in the card cage may be read by another of the processors over the bus in the card cage; and,
   at least one input/output board plugged into the card cage for communication between the master processor and devices external to the gas discharge laser control system.

2. The gas discharge laser control system of claim 1 wherein said trigger control board for controlling laser pulse energy and triggering the laser discharge is one of said slave processor boards.

3. The gas discharge laser control system of claim 2 wherein the trigger control board includes an interface for receiving a trigger command from other than over the bus structure in the card cage.

4. The gas discharge laser control system of claim 3 wherein the master processor board includes an interface for communication of signals and controls to and from parts of a gas discharge laser system from other than over the bus structure in the card cage.

5. The gas discharge laser control system of claim 1 wherein part of the memory on each processor board is flash memory and part is random access memory.

6. The gas discharge laser control system of claim 1 further comprised of an analog to digital converter board in the card cage for receiving analog signals from sensors in a gas discharge laser system and for digitizing the same for communication over the bus in the card cage, and a digital to analog converter board in the card cage for receiving digital signals over the bus in the card cage and providing analog control signals for control of parts of a gas discharge laser system.

7. The gas discharge laser control system of any one of claims 1 or 6 further comprised of a discrete digital input/output board in the card cage for providing individual line two state communication with the gas discharge laser control system.

8. The gas discharge laser control system of any one of claims 1 or 6 further comprised of a serial input/output board in the card cage for providing serial communication with the gas discharge laser control system.

9. The gas discharge laser control system of claim 8 wherein the serial input/output board in the card cage provides RS-232 serial communication with the gas discharge laser control system.

10. A gas discharge laser control system comprising:
    a plurality of processor boards coupled to a bus, each processor board containing a processor and random access memory associated therewith, one of the processor boards serving as a master processor board and each remaining processor board serving as a slave processor board, one of said processor boards being a trigger control board for controlling laser pulse energy and triggering the laser discharge;
    a memory board coupled to the bus, the memory board having address space addressable by the processors on the plurality of processor boards, whereby information written to the memory board by one of the plurality of processors over the bus may be read by another of the processors over the bus; and,
    at least one input/output board coupled to the bus for communication between the master processor and devices external to the gas discharge laser control system.

11. The gas discharge laser control system of claim 10 wherein said trigger control board for controlling laser pulse energy and triggering the laser discharge is one of said slave processor boards.

12. The gas discharge laser control system of claim 11 wherein the trigger control board includes an interface for receiving a trigger command from other than over the bus.

13. The gas discharge laser control system of claim 12 wherein the master processor board includes an interface for communication of signals and controls to and from parts of a gas discharge laser system from other than over the bus.

14. The gas discharge laser control system of claim 10 wherein part of the memory on each processor board is flash memory and part is random access memory.

15. The gas discharge laser control system of claim 10 further comprised of an analog to digital converter board for receiving analog signals from sensors in a gas discharge laser system and for digitizing the same for communication over the bus, and a digital to analog converter board for transmitting digital signals over the bus and for providing analog control signals for control of parts of a gas discharge laser system.

16. The gas discharge laser control system of any one of claims 10 or 15 further comprised of a discrete digital input/output board for providing individual line two state communication with the gas discharge laser control system.

17. The gas discharge laser control system of any one of claims 10 or 15 further comprised of a serial input/output board for providing serial communication with the gas discharge laser control system.

18. The gas discharge laser control system of claim 17 wherein the serial input/output board provides RS-232 serial communication with the gas discharge laser control system.

* * * * *